United States Patent [19]

Yamamoto et al.

[11] Patent Number: 5,305,519
[45] Date of Patent: Apr. 26, 1994

[54] MULTILEVEL INTERCONNECT STRUCTURE AND METHOD OF MANUFACTURING THE SAME

[75] Inventors: Hiroshi Yamamoto; Tomohiro Ohta, both of Chiba, Japan

[73] Assignee: Kawasaki Steel Corporation, Hyogo, Japan

[21] Appl. No.: 965,780

[22] Filed: Oct. 23, 1992

[30] Foreign Application Priority Data

Oct. 24, 1991 [JP] Japan ................... 3-277803

[51] Int. Cl.$^5$ ............................. H01K 3/10
[52] U.S. Cl. .................... 29/852; 156/646; 437/192
[58] Field of Search ............ 29/852; 156/644, 646; 437/192

[56] References Cited

U.S. PATENT DOCUMENTS 4,172,009 10/1979 Alcorn et al. ............. 156/646 X
4,824,802 4/1989 Brown et al. ............. 437/192

FOREIGN PATENT DOCUMENTS 1216969 1/1987 Canada .
434045 6/1991 European Pat. Off. .

OTHER PUBLICATIONS

Abstract of a Paper by J. Onoe and H. Yamamoto in Proc. Workshop, 6th Meeting date 1989 pp. 325-331, Ed. by S. Wong & F. Furukawa, Mater. Res. Soc: Pittsburgh, Pa. 1990.
IEEE Electron Device Letters vol. EDL-8 No. 2 Feb. 1987, pp. 76-78 by R. Mukai et al.
Proceedings of ECS Symposia, vol. 89-6 pp. 26-38, 1989.
Stress Induced Migration of Aluminum-Silicon Films: *Influencing Factors and Countermeasures.*
Reprint from Proceedings of the IEDM-Dec. 6-9, 1987, pp. 205-208.
Reliable Tungsten Encapsulated Al-Si Interconnects for Submicron Multilevel Interconnect.
VMIC Conference, Jun. 12-13, 1990, pp. 42-48.
A High Performance Four Metal Layer Interconnect System for Bipolar and BiCMOS Circuits.
VMIC Conferernce, Jun. 12-13, 1990, pp. 21-27.
An Advanced Four Level Interconnect Enhancement Module For 0.9 Micron CMOS.
VMIC Conference, Jun. 12-13, 1990, pp. 106-111.
Electromigration in a Two-Level Al-Cu Interconnection with W Studs.
IEEE Transactions on Electron Devices, vol. 37, No. 3, Mar. 1990, pp. 562-567.
Electromigration Reliability for a Tungsten-Filled Via Hole Structure.

*Primary Examiner*—Carl J. Arbes
*Attorney, Agent, or Firm*—Oliff & Berridge

[57] ABSTRACT

A multilevel interconnect structure for use in a semiconductor device including a lower metal wiring which is formed by selectively etching a stack of an aluminum alloy film deposited on a silicon substrate via an underlying insulating film and a TiW film deposited on the aluminum alloy film, an interlayer insulating film deposited on the lower metal wiring, a via hole formed in the interlayer insulating film such that the aluminum alloy film of the lower metal wiring is exposed in a bottom of the via hole, a plug made of aluminum and formed in the via hole such that a lower end of the plug is directly contacted with the aluminum alloy film of the lower metal wiring, and an upper metal wiring having an aluminum alloy film formed on the interlayer insulating film such that an upper end of the plug is directly contacted with the aluminum alloy film of the upper metal wiring. Since the upper and lower metal wirings are electrically connected to each other via interfaces of aluminum-aluminum alloy, the via resistance can be decreased and the electromigration reliability can be improved.

17 Claims, 15 Drawing Sheets

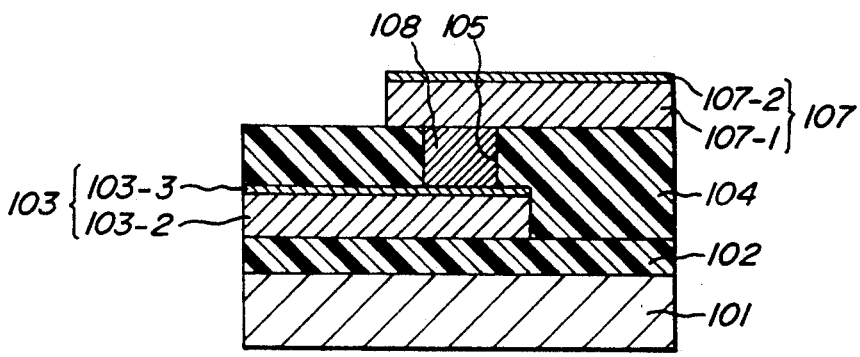
FIG_1
PRIOR ART
FIG_2A
PRIOR ART
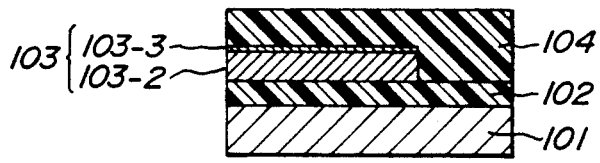
FIG_2B
PRIOR ART
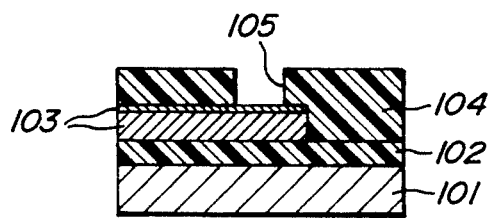
FIG_2C
PRIOR ART
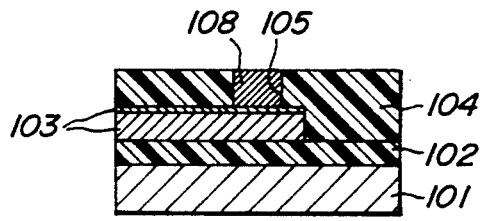
FIG_2D
PRIOR ART
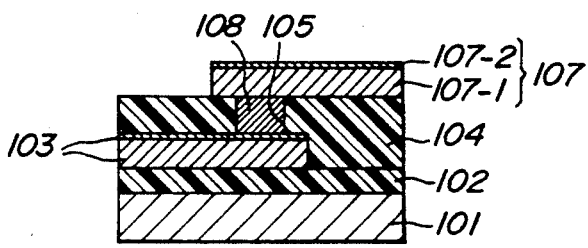
FIG_2E
PRIOR ART

FIG_3
PRIOR ART
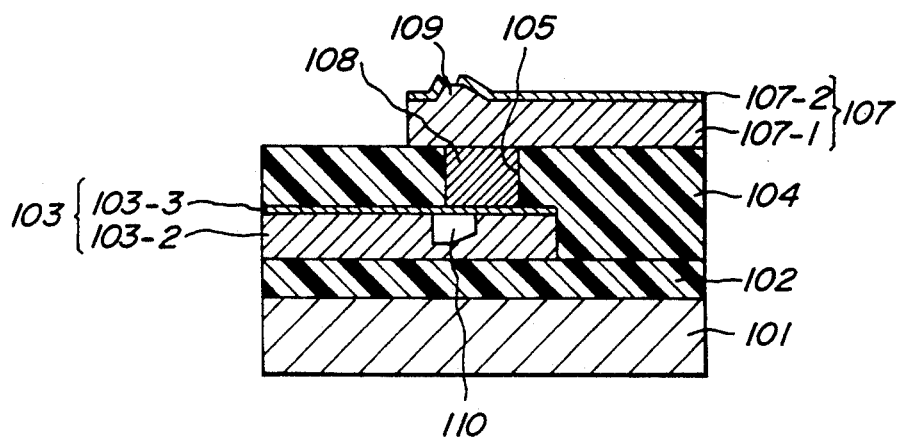
FIG_4
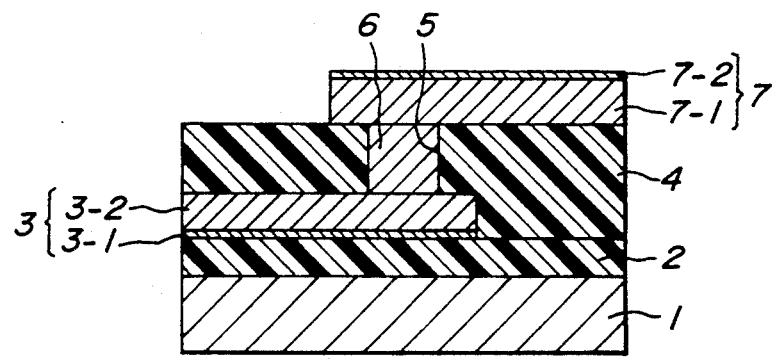

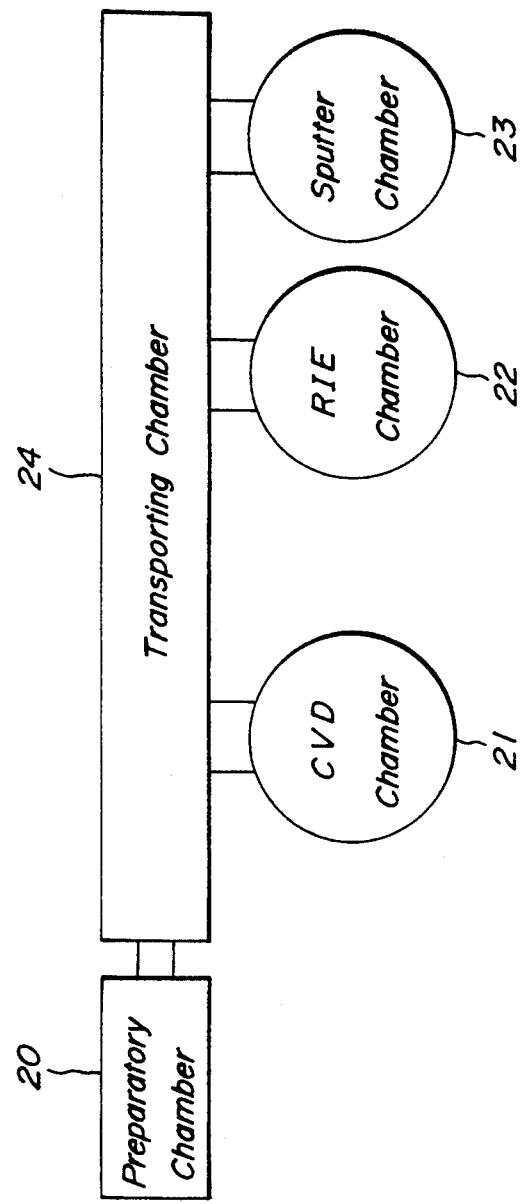

FIG._7 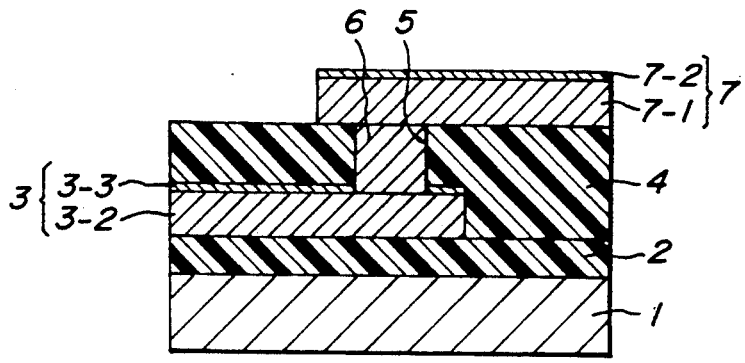
FIG._8A 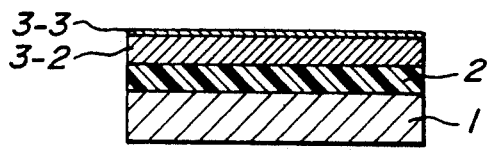
FIG._8B 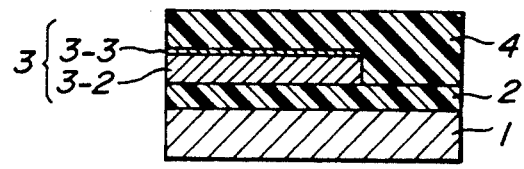
FIG._8C 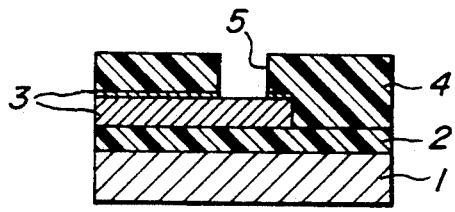
FIG._8D 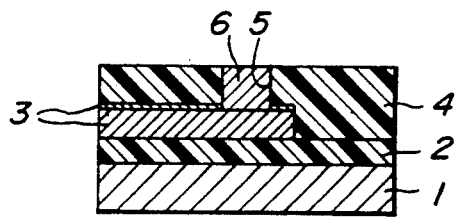
FIG._8E 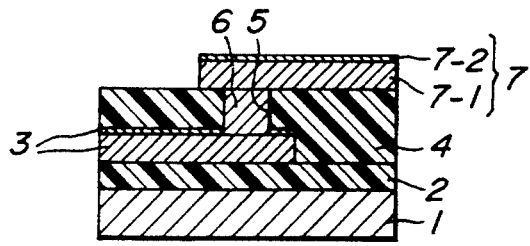

FIG_10
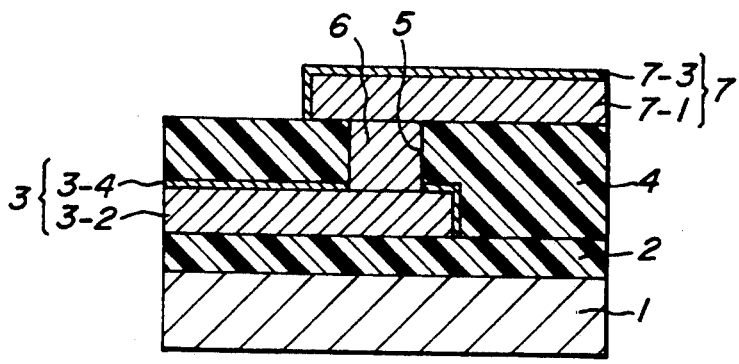
FIG_11A
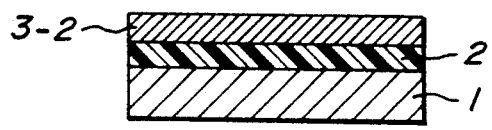
FIG_11B
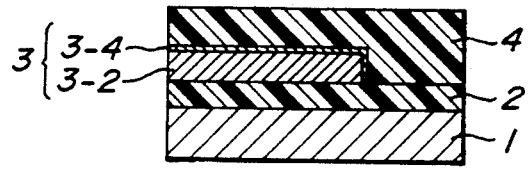
FIG_11C
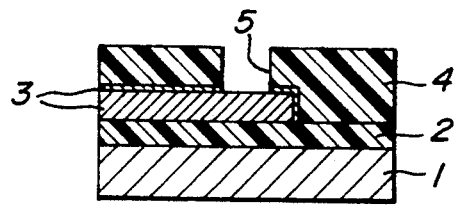
FIG_11D
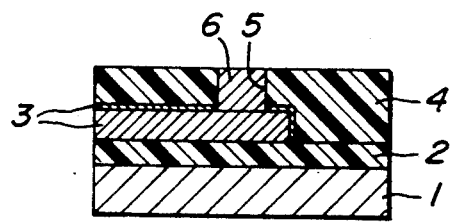
FIG_11E
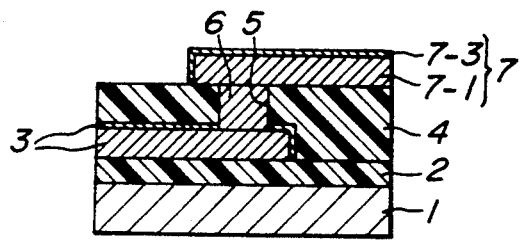

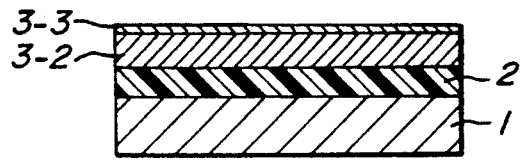
FIG_12A
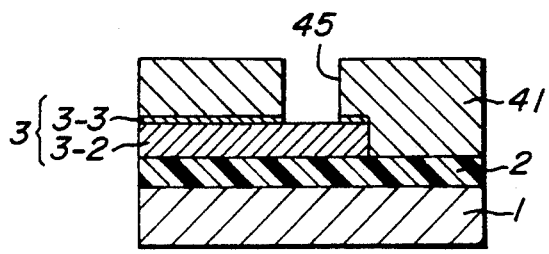
FIG_12B
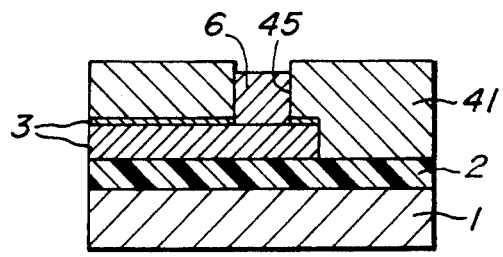
FIG_12C
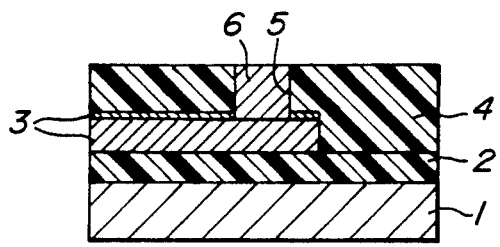
FIG_12D
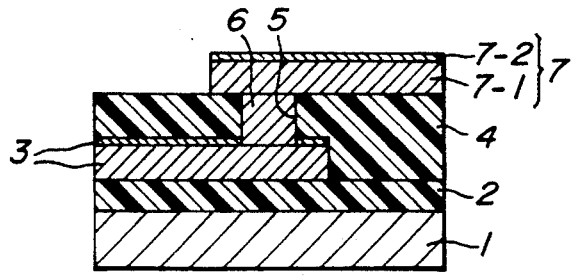
FIG_12E FIG_13
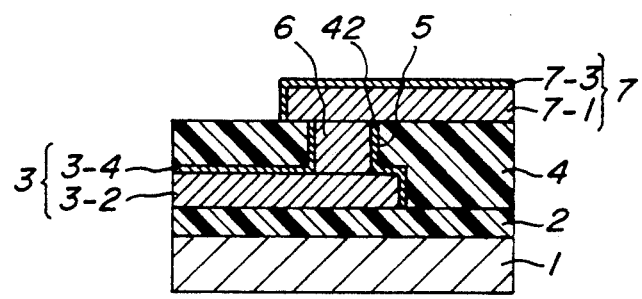

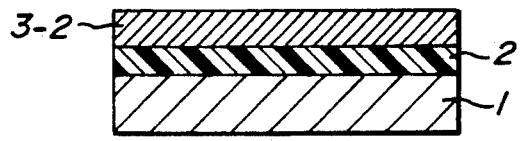
FIG_14
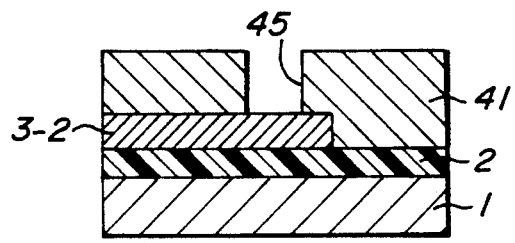
FIG_15
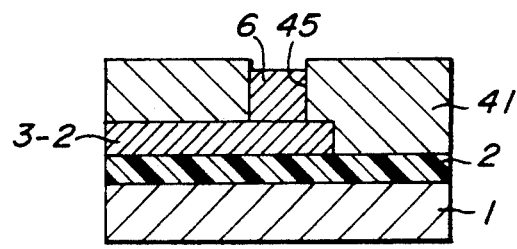
FIG_16
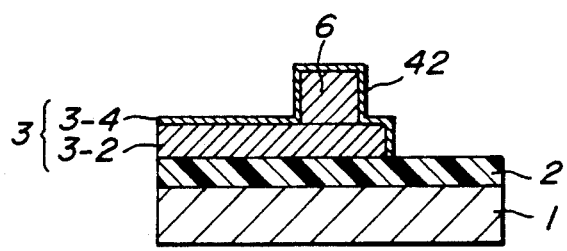
FIG_17
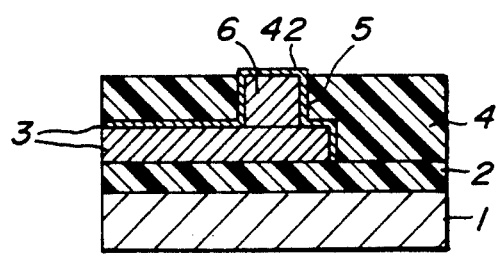
FIG_18

FIG_19
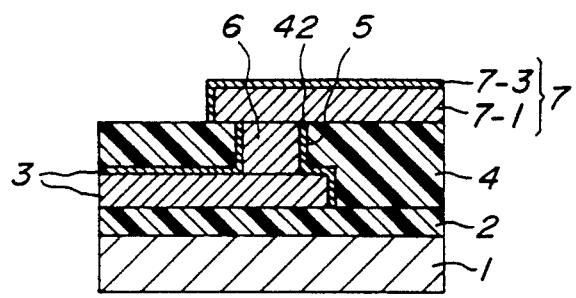

FIG._20A 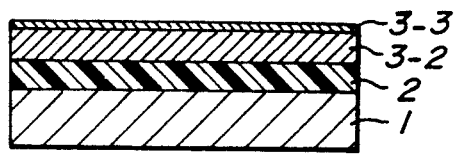 FIG._20B 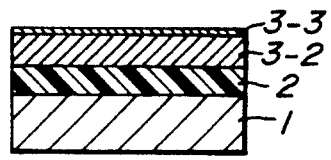
FIG._21A 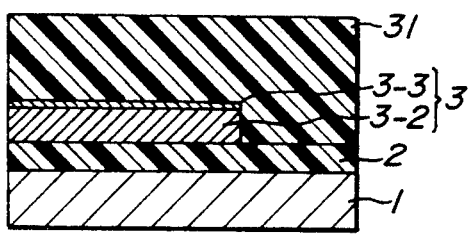 FIG._21B 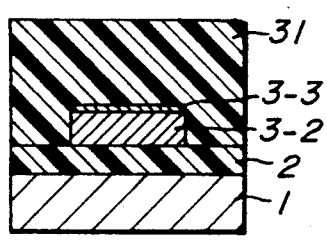
FIG._22A 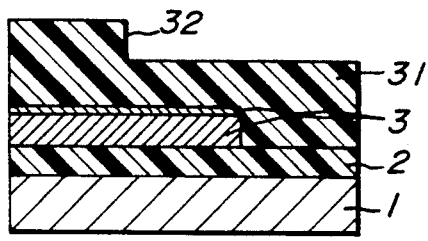 FIG._22B 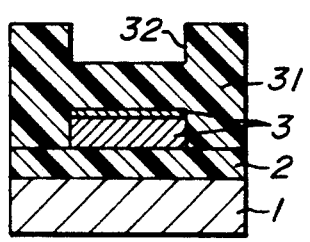
FIG._23A 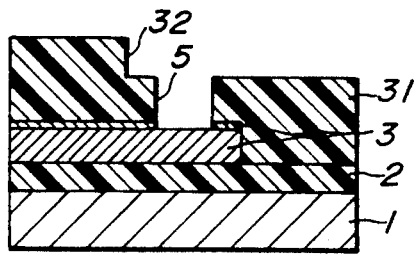 FIG._23B 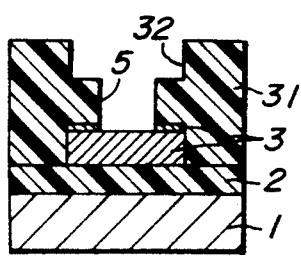

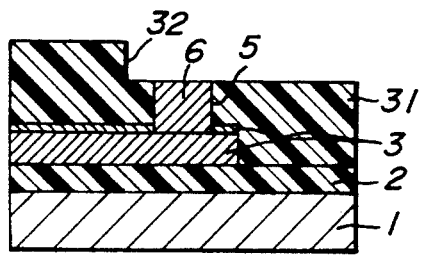
FIG_24A
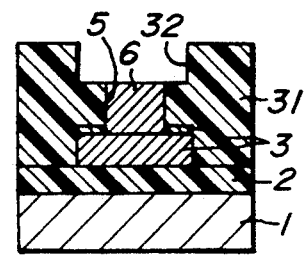
FIG_24B
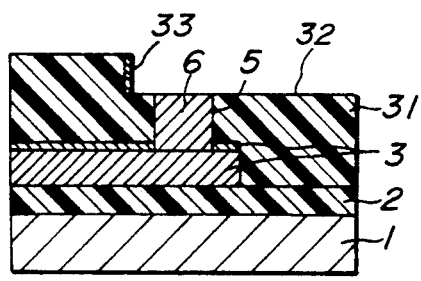
FIG_25A
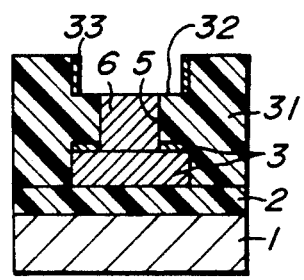
FIG_25B
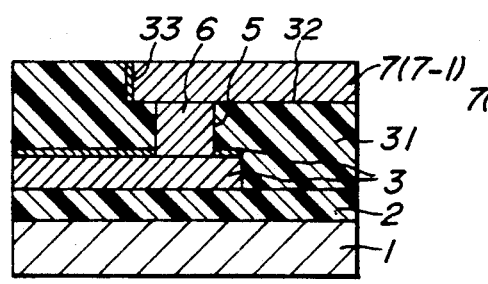
FIG_26A
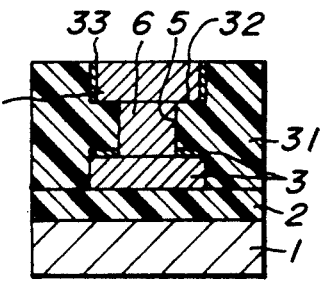
FIG_26B

MULTILEVEL INTERCONNECT STRUCTURE AND METHOD OF MANUFACTURING THE SAME

BACKGROUND OF THE INVENTION

1. Field of the Invention

The present invention relates to a multilevel interconnect structure for use in a semiconductor device and more particularly relates to a multilevel interconnect structure in which upper and lower level metal wirings are interconnected by means of a plug provided in a via hole formed in an interlayer insulating layer arranged between the upper and lower metal wirings, said plug forming a current path from which an undesired interface between different kinds of metals are removed so that a reliability of the semiconductor device is improved.

The present invention also relates to a method of manufacturing the above mentioned multilevel interconnect structure.

2. Related Art Statements

Heretofore, in an LSI having a design rule larger than about 1 μm, a metal wiring pattern of a multilevel interconnect structure has been formed by selectively etching a single aluminum or aluminum alloy film into a desired pattern. Further, in order to form an interconnection between lower and upper metal wirings, an interlayer insulating film is formed on the lower metal wiring, a via hole is formed in the interlayer insulating film, and then a metal film is deposited in the via hole as well as on the interlayer insulating film. After that the metal film is selectively etched into a desired pattern to form the upper metal wiring.

In accordance with the progress in the miniaturization of the semiconductor device, the design rule of LSI has been made smaller than 1 μm. Then, in the known multilevel interconnect structure metal formed in the manner mentioned above, the reliability of the device might be decreased due to the stressmigration In order remove such a problem, there have been proposed several techniques. For instance, in K. Katto and S. Shimizu, Proceedings of ECS Symposia, Vol. 89-6, p. 26, 1989 (reference 1), there is described a method of manufacturing the multilevel interconnect structure, in which a metal wiring pattern is formed by selectively etching a stack of at least one aluminum alloy film and at least one high melting point metal alloy film such as TiW, TiN and MoSi$_x$. Further, H. Yamamoto, S. Fujii, T. Kakiuchi, K. Yano and T. Fujita reported in Technical Digest of International Electron Device Meeting, Washington D.C., December 6–9, p. 205, 1987 (reference 2) has proposed another known method of manufacturing the multilevel interconnect structure. In this known method, after an aluminum alloy film is shaped into a desired pattern, upper surface and side wall of the aluminum alloy film pattern are covered with a high melting point metal film such as W film. The multilevel interconnect structure formed by this known method has been proved to have a high reliability, and thus this technique has been considered to be essential for realizing LSI having the design rule smaller than about 0.8 μm.

In the known methods which have been used for manufacturing multilevel interconnect structure for use in LSI having the design rule larger than about 1 μm, it is difficult to obtain a good interconnection between the lower and upper metal wirings and thus the yield and reliability of the semiconductor device might be decreased. That is to say, the upper metal wiring is generally formed by the sputtering which has a poor step coverage, and therefore the thickness of the metal film deposited on the inner wall of the via hole is liable to be thin and the interconnection might be broken at this point.

In S. R. Wilson et al, Preceding of the Seventh International IEEE VLSI Multilevel Interconnection Conference, p. 42, 1990 (reference 3), there is disclosed another known method of forming the multilevel interconnection structure, in which the via hole is formed to have a trapezoidal cross sectional configuration and the step coverage of an aluminum alloy film constituting the upper metal wiring is improved by controlling the substrate temperature during the deposition of the aluminum alloy. However, such a technique could not be practically applied to LSI having the design rule smaller than about 0.6 μm.

In view of the above, for LSI having the design rule smaller than about 0.6 μm, a method in which at first the via hole is filled with the metal plug to form a flat surface and then the upper metal film is formed on this flat surface has been considered to be a major method. In the above mentioned reference 3, there is described a known method, in which a plug is formed by selectively depositing tungsten in the via hole by means of a selective CVD method. Further, in C. A. Bollinger et al, Proceeding of the Seventh International IEEE VLSI Multilevel Interconnection Conference, p. 21, 1990 (reference 4), there is proposed another known method of forming the plug in the via hole. In this known method, a barrier metal film such as TiW film is deposited in the via hole as well as on the interlayer insulating film, a W film is formed on the whole surface of the TiW film, and then a portion of the W film on the interlayer insulating film is selectively removed.

FIG. 1 is a cross sectional view showing the known multilevel interconnect structure for use in LSI having the design rule smaller than about 0.6 μm. On a silicon substrate 101 there is deposited an underlaying insulating film 102 A lower metal wiring 103 is consisting of an aluminum alloy film 103-2 and a TiW film 103-3 and an upper metal wiring 107 is consisting of an aluminum alloy film 107-1 and a TiW film 107-2. Such a multilevel interconnect structure has a sufficient reliability for use in LSI having the design rule smaller than 0.6 μm. The lower and upper metal wirings 103 and 107 are physically and electrically isolated by an interlayer insulating film 104 and a via hole 105 is formed in the insulating film 104. In the via hole 105 there is formed a plug 108 made of tungsten In this manner, the multilevel interconnection structure which could be effectively used for LSI having the design rule smaller than 0.6 μm can be obtained.

FIGS. 2A to 2E are cross sectional views illustrating successive steps of a known method for manufacturing the known multilevel interconnection structure shown in FIG. 1.

As shown in FIG. 2A, on a silicon substrate 101 there has been formed an underlaying insulating film 102. On the insulating film 102 there is formed an aluminum alloy film 103-2 having a thickness of 300, to 800 nm by means of sputtering. On the aluminum alloy film 103-2 there is further formed a TiW film 103-3 having a thickness of 20 to 100 nm also by means of sputtering.

Next, as illustrated in FIG. 2B, a stack of the aluminum alloy film 103-2 and TiW film 103-3 is shaped into a desired pattern to form a lower metal wiring 103. Then, an interlayer insulating film 104 is formed on the lower metal wiring 103 as well as on the exposed underlaying insulating film 102. The interlayer insulating film 104 may be formed by a combination of a $SiO_2$ film deposited by, for instance plasma CVD method and a spin-on-glass film (SOG film).

Next, in the interlayer insulating film 104 there is formed a via hole 105 as depicted in FIG. 2C, and then CVD process is carried out in an atmosphere including, for instance $WF_6$ and $SiH_4$ to deposit a tungsten selectively in the via hole to form a tungsten plug 108 in the via hole 105. This condition is shown in FIG. 2D.

Finally an aluminum alloy film 107-1 having a thickness of 400 to 1000 nm is formed by, for instance sputtering and then a TiW film 107-2 having a thickness of 20 to 100 nm is formed also by sputtering. Then, a stack of the aluminum alloy film 107-1 and TiW film 107-2 is selectively etched in accordance with a given pattern to form an upper metal wiring 107 as shown in FIG. 2E.

In the known multilevel interconnect structure shown in FIG. 1, two interfaces between different kinds of metals are provided in a current path between the lower metal wiring 103 and the plug 108. That is to say, there are formed a first interface between the aluminum alloy film 103-2 and the TiW film 103-2, a second interface between the TiW film 103-3 and the tungsten plug 108, and a third interface between the tungsten plug 108 and the aluminum alloy film 107-1. The existence of these interfaces between different kinds of metals results in the deterioration in the electrical property of the multilevel interconnection. For example, the via contact resistance becomes higher than the case in which the interconnection as performed by the contacts between the same kinds of metal such as aluminum alloy-aluminum alloy. This has been described in the above mentioned reference 3.

The reliability of the via interconnection in the above explained known multilevel interconnect structure can be really improved due to the fact that the upper metal wiring 107 is formed by depositing the metal film on the flat surface which is realized by filling the via hole 105 with the metal of the plug 108, and therefore the breakage of the interconnection by means of the plug 108 due to the decrease in the thickness of the upper wiring metal film on the side wall of the via hole can be prevented as compared with the case in which the plug is not used. This has been described in F. Matsuoka et al, IEEE Transactions on Electron Devices. Vol 37, No. 3, p. 562, 1990 (reference 5). However, as described in T. Kwok et al, Proceeding of the Seventh International IEEE VLSI Multilevel Interconnection Conference, p. 106, 1990 (reference 6), when the interface between different kinds of metals is provided in the current path, there is produced a discontinuity in the movement of carrier substances in the metal wiring, so that the electromigration reliability might be decreased to a large extent as compared with the metal wiring formed on a flat substrate. That is to say, when it is assumed that a current flows from the lower metal wiring to the upper metal wiring, the movement of aluminum atoms which is caused by an electron flow passing through the aluminum alloy film 107-1 in the upper metal wiring 107 is prevented by the interface between the aluminum alloy film 107-1 and the tungsten plug 108. Therefore, the aluminum atoms are stored in the upper metal wiring 107, so that a hillock 109 is formed in the upper metal wiring near the via hole 105. The hillock might produce a breakage of the TiW film 107-2 of the upper metal wiring 107. At the same time, a void 110 might be formed in the lower metal wiring 103 in the vicinity of the via hole 105 as shown in FIG. 3. This is due to the fact that aluminum atoms in the aluminum alloy film 103-2 in the lower metal wiring 103 are moved by the electron flow although the supply of aluminum atoms from the upper metal wiring 107 is prevented by the interface between the aluminum alloy film 107-1 and the W plug 108. These hillock 109 and void 110 might cause the shortcircuit and breakage of the interconnection between the lower and upper metal wirings 103 and 107 and might increase the resistance of the interconnection.

Similarly the interface between metals of different kinds produces the discontinuity in the movement of impurities such as Si and Cu added in the aluminum alloy film and the concentration of the impurity becomes non-uniform. For instance, in the above mentioned reference 5 there is described that the resistance of the via contact is increased by the discontinuity in the movement of Si atoms. Further in the reference 6, there is explained that when the concentration of Cu atoms is locally decreased at a portion near the via connection, the electromigration reliability might be decreased at such a portion.

As explained above, in LSI having the design rule smaller than about 0.5 $\mu$m, the known multilevel interconnect structure shown in FIG. 1 could not be utilized, because the operation speed of the semiconductor device is limited due to the increase in the via contact resistance and the reliability of the device is decreased by the electromigration.

SUMMARY OF THE INVENTION

The present invention has for its object to provide a useful and novel multilevel interconnect structure which can be advantageously used for a fine semiconductor device having a design rule smaller than about 0.5 $\mu$m without causing the undesired decrease in the operation speed and electromigration reliability.

According to the invention, a multilevel interconnect structure for use in a semiconductor device comprises:

a lower metal wiring including at least one aluminum or aluminum alloy film and at least one high melting point metal or high melting point metal alloy film;

an upper metal wiring mainly consisting of aluminum or aluminum alloy;

an interlayer insulating film formed between said lower and upper metal wirings such that the lower and upper metal wirings are electrically isolated from each other by said interlayer insulating film;

a via hole formed in said interlayer insulating film such that the lower and upper metal wirings are communicated with each other by means of said via hole; and a plug made of aluminum or aluminum alloy and formed in said via hole such that the plug is brought into contact with the lower and upper metal wirings by means of interfaces of aluminum-aluminum, aluminum-aluminum alloy, or aluminum alloy-aluminum alloy.

In a preferable embodiment of the multilevel interconnect structure according to the invention, the lower metal wiring is formed by an aluminum or aluminum alloy film and a high melting point metal or high melting point metal alloy film such as TiW film applied on said aluminum or aluminum alloy film and said plug is directly contacted with the aluminum or aluminum alloy film of the lower metal wiring. It is also preferable to cover the upper surface of the aluminum or aluminum alloy film as well as its side wall with the high melting point metal film. Moreover, in another preferable embodiment of the multilevel interconnect structure according to the invention, an inner wall of the via hole is also covered with the high melting point film.

In the multilevel interconnect structure according to the invention, the lower metal wiring includes at least one aluminum or aluminum alloy film and at least one high melting point metal film, and thus the stressmigration reliability is improved. Further the plug is made of aluminum or aluminum alloy and is brought into contact with the upper and lower metal wirings via the aluminum-aluminum contact or aluminum-aluminum alloy contact or aluminum alloy-aluminum alloy contact, so that there is not provided the undesired interface between metals of different kinds. Therefore, the increase in the via resistance can be avoided and the decrease in the electromigration reliability can be also prevented.

The present invention also relates to a method of manufacturing the multilevel interconnect structure reliably at a high yield.

According to the invention, a method of manufacturing a multilevel interconnect structure for use in a semiconductor device comprises the steps of:

forming a lower metal wiring having a given pattern on a semiconductor substrate, said lower metal wiring comprising at least one aluminum or aluminum alloy film and at least one high melting point metal or high melting metal alloy film;

forming an interlayer insulating film on said lower metal wiring;

forming a via hole in said interlayer insulating film such that said aluminum or aluminum alloy film is exposed at a bottom of the via hole;

forming a plug made of aluminum or aluminum alloy in said via hole such that a lower end of said plug is directly contacted with the aluminum or aluminum alloy film of the lower metal wiring; and forming an upper metal wiring comprising an aluminum or aluminum alloy film which is directly contacted with an upper end of said plug.

In a preferable embodiment of the method according to the invention, said lower metal wiring is formed by applying a high melting point film on an aluminum or aluminum alloy film and said via hole is formed such that the high melting point metal film is exposed at the bottom of the via hole. Then, the exposed high melting point metal is removed and then the aluminum or aluminum alloy plug is formed in the via hole. It is preferable to perform said process for removing the high melting point metal film within the via hole and said process for forming the plug continuously without exposing the substrate to the atmosphere.

According to further aspect of the present invention, a method of manufacturing a multilevel interconnect structure for use in a semiconductor device comprises the steps of:

forming a lower metal wiring having a given pattern on a semiconductor substrate, said lower metal wiring comprising at least one aluminum or aluminum alloy film and at least one high melting point metal or high melting metal alloy film;

forming a plug on said aluminum or aluminum alloy film of the lower metal wiring, said plug being made of aluminum or aluminum alloy;

forming an interlayer insulating film on said lower metal wiring such that an upper end of said plug is exposed from the interlayer insulating film; and forming an upper metal wiring comprising an aluminum or aluminum alloy film which is directly contacted with the upper end of said plug.

In this method, it is no more necessary to use a technique for forming the via hole in the interlayer insulating film with a high precision.

According to further aspect of the invention, a method of manufacturing a multilevel interconnect structure for use in a semiconductor device comprises the steps of:

depositing an aluminum or aluminum alloy film on a semiconductor substrate;

selectively etching said aluminum or aluminum alloy film in accordance with a given pattern to form a fine wire;

forming a plug on said fine wire formed by said aluminum or aluminum alloy film, said plug being made of aluminum or aluminum alloy;

covering upper surface and side wall of said fine wire with a high melting point metal or high melting point metal alloy film to form a lower metal wiring having said given pattern;

covering at least a side wall of said plug with a high melting point metal or high melting point metal alloy film;

forming an interlayer insulating film on said lower metal wiring such that an upper end of said plug is exposed from the interlayer insulating film; and forming an upper metal wiring comprising an aluminum or aluminum alloy film which is directly contacted with the upper end of said plug.

In this method, the plug is effectively protected by the high melting point metal or high melting point metal alloy film formed on the side wall of the plug, so that the reliability of the multilevel interconnect structure can be further improved.

BRIEF DESCRIPTION OF THE DRAWINGS

FIG. 1 is a cross sectional view showing a known multilevel interconnect structure for use in LSI having a design rule smaller than 0.6 μm;

FIGS. 2A, 2B, 2C, 2D and 2E are cross sectional views illustrating successive steps of a known method of manufacturing the known multilevel interconnect structure shown in FIG. 1;

FIG. 3 is a cross sectional view depicting a known multilevel interconnect structure having defects;

FIG. 4 is a cross sectional view illustrating an embodiment of the multilevel interconnect structure according to the invention;

FIG. 6 is a schematic view showing a processing apparatus for carrying out the method according to the invention;

FIG. 7 is a cross sectional view showing another embodiment of the multilevel interconnect structure according to the invention;

FIGS. 8A, 8B, 8C, 8D and 8E are cross sectional views representing successive steps of an embodiment of the method of manufacturing the multilevel interconnect structure shown in FIG. 7;

FIG. 10 is a cross sectional view showing still another embodiment of the multilevel interconnect structure according to the invention;

FIG. 11A, 11B, 11C, 11D and 11E are cross sectional views representing successive steps of an embodiment of the method of manufacturing the multilevel interconnect structure shown in FIG. 10;

FIGS. 12A, 12B, 12C, 12D and 12E are cross sectional views representing successive steps of still another embodiment of the method of manufacturing the multilevel interconnect structure illustrated in FIG. 7;

FIG. 13 is a cross sectional view showing still another embodiment of the multilevel interconnect structure according to the invention;

FIG. 14 is a cross sectional view showing a first step of an embodiment of the method of manufacturing the multilevel interconnect structure illustrated in FIG. 13;

FIGS. 15, 16, 17 18 and 19 are cross sectional views showing successive steps for manufacturing the multilevel interconnect structure shown in FIG. 13;

FIGS. 20A, 20B; 21A, 21B; 22A, 22B; 23A, 23B; 24A, 24B; 25A, 25B and 26A, 26B are cross sectional views illustrating successive steps of another embodiment of the method of manufacturing the multilevel interconnect structure according to the invention;

DESCRIPTION OF THE PREFERRED EMBODIMENTS

Figure 5A:
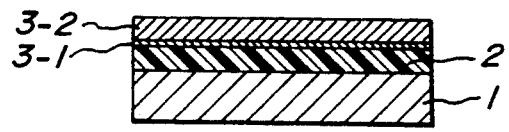
FIGS. 5A, 5B, 5C, 5D and 5E are cross sectional views showing successive steps of an embodiment of the method of manufacturing the multilevel interconnect structure depicted in FIG. 4.

FIG. 4 is a cross sectional view showing an embodiment of the multilevel interconnect structure according to the invention. On a silicon substrate 1 there has been formed an underlaying insulating film 2 and a lower metal wiring 3 is first formed on the insulating film 2. The lower metal wiring 3 includes a TiW film 3-1 applied on the insulating film 2 and an aluminum alloy film 3-2 formed on the TiW film. An upper metal wiring 7 comprises an aluminum alloy film 7-1 formed on an interlayer insulating film 4 and a TiW film 7-2 formed on the aluminum alloy film 7-1. In the interlayer insulating film 4 there is formed a via hole 5 and a plug 6 made of aluminum is formed in the via hole 5 such that the lower and upper metal wirings 3 and 7 are electrically interconnected by means of the plug 6. According to the invention, a lower end of the aluminum plug 6 is brought into direct contact with the aluminum alloy film 3-2 of the lower metal wiring 3 and an upper end of the plug is also brought into direct contact with the aluminum alloy film 7-1 of the upper metal wiring 7. That is to say, the lower and upper metal wirings 3 and 7 are electrically interconnected with each other via the aluminum alloy-aluminum contacts and there is not provided any undesired interface between metals of different kinds.

In and on a surface of the silicon substrate 1 there are formed various regions of a semiconductor device such as diffusion regions, channel regions and gate electrodes, but for the sake of simplicity these regions are not shown in FIG. 4. Further, in the underlaying insulating film 2 there are formed contact holes and contact structures are formed for electrically connecting the regions to the lower metal wiring 3. However, in FIG. 4 such a construction is not also shown. Moreover, in the embodiment illustrated in FIG. 4, the bilevel interconnect structure is shown, but according to the invention more than three-level interconnect structure can be realized. In such a case, one or more interconnect structure may be provided under lower metal wiring 3 and/or above the upper metal wiring 7.

In the embodiment shown in FIG. 4, both the lower and upper metal wirings 3 and 7 are formed by the stack of the aluminum alloy film and TiW film, but if a minimum line width of the upper metal wiring is larger than that of the lower metal wiring, the upper metal wiring may be formed by a single aluminum or aluminum alloy film. Practically, if the minimum line width of the upper metal wiring 7 is about 1.0 $\mu$m, the upper metal wiring may be formed by a single aluminum or aluminum alloy film. However, the design rule of the upper metal wiring 7 is smaller than about 0.6 $\mu$m, it is preferable to form the upper metal wiring by the stack of the aluminum or aluminum alloy film and high melting point metal or high melting point metal alloy film as shown in FIG. 4.

The TiW film 3-1 of the lower metal wiring 3 may be formed by sputtering. This TiW film 3-1 serves as a barrier metal for preventing any undesired reaction at a contact interface between the lower metal wiring 3 and a diffusion region. Of course, the TiW film 3-1 has its specific function for improving the reliability of the lower metal wiring. The high melting point metal alloy film such as TiN, WN and TiON film may be used instead of TiW film 3-1 and further a high melting point metal film such as W and Ta film may be also used. Moreover, the lower metal wiring 3 may be formed by a stack of a Ti film, a TiW film and a WN film for preventing the reaction between the TiW film and the aluminum alloy film 3-2. The TiW film 7-2 of the upper metal wiring 7 may be also formed by sputtering. This TiW film 7-2 serves as an anti-reflection film which decreases the reflective coefficient for the exposing light for patterning the upper metal wiring 7 in order to increase the precision of the pattern of the upper metal wiring 7. The TiW film 7-2 also serves to improve the reliability of the upper metal wiring 7. It should be noted that the high melting point metal film of the upper metal wiring 7 may be also formed by a single high melting point metal or high melting point metal alloy film or a stack of a plurality of high melting point metal or high melting point metal alloy films.

The aluminum alloy film 3-2 of the lower metal wiring 3 may be formed by, for instance the sputtering. Further Cu may be added to the aluminum alloy film 3-2 in order to improve the reliability of the lower metal wiring 3. In this case, Cu may be added by about 0.1 to 5 weight %. In view of the reliability improving effect and processability, it is preferable to add Cu by about 0.5 weight %. Moreover, Ti, Pd, Hf and B may be added to the aluminum alloy film 3-2 for improving the reliability of the lower metal wiring 3. Further Si may be added to the aluminum alloy film 3-2 by about 0.5 to 2 weight %. According to the invention, an aluminum film containing no impurity may be used instead of the aluminum alloy film 3-2. However, in this case a method and conditions for depositing the aluminum film have to be considered in order to obtain the aluminum film having a good property. The aluminum or aluminum alloy film may be deposited by CVD method. The aluminum alloy film 7-2 of the upper metal wiring 7 may be also formed by a usual process such as sputtering and CVD. It should be noted that the aluminum or aluminum alloy film 3-2 of the lower metal wiring 3 and the aluminum alloy film 7-1 of the upper metal wiring 7 may be made of the same or different materials.

The aluminum plug 6 may be formed by CVD method using dimethylaluminum hydride (refer to DMAH hereinafter) as raw material Instead of DMAH, triisobutylaluminum, trimethylamine alane, dimethylethylamine alane and intermolecular compound between triethylaluminum and dimethylaluminum hydride may be used for forming the aluminum plug 6. When the aluminum alloy films 3-2 and 7-1 and plug are made of the same aluminum alloy containing the same impurity and having the same crystal structure, the reliability of the multilevel interconnect structure would be optimum, so that it is preferable to add Cu to the plug 6. However, in the presently available CVD method for depositing the aluminum, it is difficult to add Cu impurity. Since Cu can be easily diffused in the aluminum film, after depositing the aluminum alloy films 3-2 and 7-1 having Cu impurity added thereto, the assembly is heated at a temperature such as 400° C. and Cu impurity is diffused from the aluminum alloy films into the aluminum plug 6. In this case, in order to make the concentration of Cu impurity in the plug 6 uniform, Cu impurity has to be added to the aluminum alloy films 3-2 and 7-1 at substantially the same concentration.

In the feature, if it is possible to deposit an aluminum alloy having the reliability improving impurity added thereto, the aluminum alloy plug may be formed directly by CVD method.

The interlayer insulating film 4 may be formed by, for instance a combination of CVD-SiO$_2$ and SOG (spin-on-glass).

FIGS. 5A to 5E are cross sectional views showing successive steps of an embodiment of the method of manufacturing the multilevel interconnect structure shown in FIG. 4 according to the invention.

At first, as illustrated in FIG. 5A, on a silicon substrate 1 there is formed an underlaying insulating film 2 and then a TiW film 3-1 having a thickness of 50 to 300 nm and an aluminum alloy film 3-2 having a thickness of 300 to 800 nm are successively formed on the insulating film 2 by the sputtering.

Figure 5B:
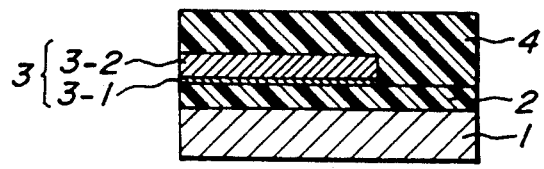

Then, a metal film consisting of a stack of the TiW film 3-1 and aluminum alloy film 3-2 is selectively etched in accordance with a desired pattern to form a lower metal wiring 3. Then, an interlayer insulating film 4 is formed on the lower metal wiring 3 as depicted in FIG. 5B. The lower metal wiring 3 may be formed by providing a resist pattern by means of an pattern exposure apparatus, removing a portion of the aluminum alloy film 3-2 which is not covered with the resist by the reactive ion etching (RIE) using a chlorine containing gas, removing an exposed portion of the TiW film 3-1 by RIE using a fluorine containing gas, and removing the resist.

Next, an interlayer insulating film 4 is formed on the lower metal wiring 3 as well as on the exposed underlaying insulating film 2. This interlayer insulating film 4 may be formed by depositing CVD-SiO$_2$ film having a thickness of 300 nm, depositing a SOG film such that a thickness at a flat portion amounts to 300 nm, effecting a thermal processing and depositing CVD-SiO$_2$ film having a thickness of 200 nm. In an alternative method of forming the interlayer insulating film 4, a SiO$_2$ film having a thickness of 100 nm is formed by plasma CVD using a mixture gas of tetraethylorthosilicate (TEOS) and oxygen, a SiO$_2$ film having a thickness of 1.0 $\mu$m is formed by atmospheric pressure CVD using a mixture gas of TEOS and ozone, and the later SiO$_2$ film is etched back such that a thickness at a flat portion becomes 300 nm and finally a SiO$_2$ film having a thickness of 500 nm is formed by plasma CVD.

Figure 5C:
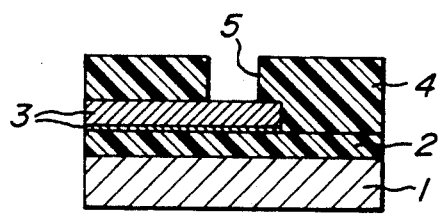

Next, as shown in FIG. 5C, a via hole 5 is formed in the interlayer insulating film 4. This process may be carried out by forming a resist with the aid of the exposing apparatus, removing a portion of the insulating film which is not covered with the resist by RIE, and removing the resist pattern. In this case, in order to manufacture the fine metal wiring it is preferable that the inner wall of the via hole 5 is substantially at right angles with respect to the surface of the silicon substrate.

Figure 5D:
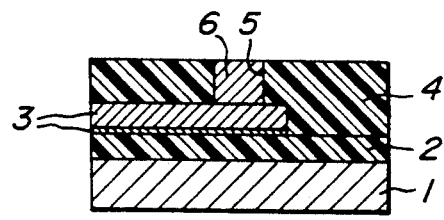

Next, an aluminum plug 6 is formed in the via hole 5 as shown in FIG. 5D by selectively depositing aluminum in the via hole by means of CVD using the starting material of DMAH. The aluminum plug 6 may be formed by depositing an aluminum film all over the surface and then the aluminum film other than in the via hole is removed. However, the above mentioned selective deposition is preferable, because in this case it is not necessary to remove the aluminum film and further even if the inner wall of via hole 5 is inclined at an angle larger than 90 degrees with respect to the surface of the silicon substrate 1, the aluminum can be effectively deposited in the via hole without forming any void. However, in the selective deposition method, the surface of the wafer has to be extremely cleaned. Particularly, the inner wall of the via hole 5 is liable to be converted into oxide or fluoride due to the fact that the surface of aluminum alloy film 3-2 is exposed to charged particles during the overetching process which is performed for compensating the fluctuation in the thickness of the interlayer insulating film 4 and in the RIE speed for forming the via hole. Further sputtered aluminum atoms might be applied onto the inner wall of the via hole in the form of oxide or fluoride. In case of forming the aluminum plug 6 by the selective deposition by CVD using the organic aluminum compound such as DMAH, the above mentioned problem should be removed.

In order to avoid the deterioration of the exposed surface of the aluminum alloy film 3-2, it is preferable to perform the cleaning process for removing the aluminum oxide or fluoride and the formation of the plug 6 continuously without exposing the wafer to the atmosphere. FIG. 6 is a schematic view showing an apparatus for processing the wafer in the above mentioned manner. The apparatus comprises preparatory chamber 20, CVD chamber 21, RIE chamber 22 and sputter chamber 23, these chambers being communicated with each other by means of a transporting chamber 24, so that the silicon wafer can be moved between the processing chambers 21, 22 ad 23 without exposing it to the atmosphere. By using the above explained processing apparatus, after effecting the cleaning process by using chlorine containing gas in the RIE chamber 22, the silicon wafer may be transported into the CVD chamber 21 for depositing the aluminum in the via hole 5 to form the plug 6.

Figure 5E:
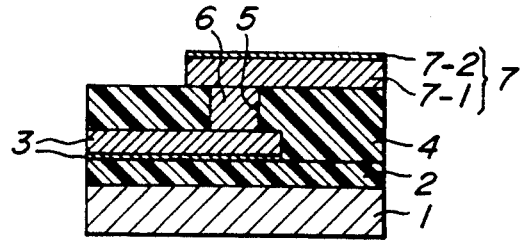

Next, an aluminum alloy film 7-1 having a thickness of 400 to 1000 nm is deposited by the sputtering and then a TiW film 7-2 having a thickness of 20 to 100 nm is deposited on the film 7-1 also by the sputtering. Finally a metal film consisting of a stack of the aluminum alloy film 7-1 and TiW film 7-2 is selectively etched in accordance with a given pattern to form an upper metal wiring 7 as shown in FIG. 5E. In this manner, the multilevel interconnect structure illustrated in FIG. 4 can be manufactured.

If the aluminum alloy film 7-1 of the upper metal wiring 7 is formed by a separate apparatus from an apparatus for forming the aluminum plug 6, prior to the deposition of the aluminum alloy, an aluminum oxide film formed on the upper surface of the aluminum plug is preferably removed by the sputter etching using Ar ions. Then, the electrical property of the interconnect can be further improved. If the apparatus shown in FIG. 6 is used to form the aluminum alloy film 7-1, after the aluminum plug 6 has been formed in the CVD chamber 21, the silicon wafer is transported into the sputter chamber 23 and the aluminum alloy film 7-1 is deposited. Then the aluminum oxide film is hardly formed on the upper surface of the aluminum plug 6, and thus the much superior electrical property can be obtained.

FIG. 7 is a cross sectional view showing another embodiment of the multilevel interconnect structure according to the invention. In the embodiment illustrated in FIG. 4, the lower metal wiring 3 is formed by depositing the aluminum alloy film 3-2 on the TiW film 3-1. In the present embodiment, the lower metal wiring 3 is composed of an aluminum alloy film 3-2 deposited on the underlaying insulating film 2 and a TiW film 3-3 deposited on the aluminum alloy film 3-2. At a bottom of a via hole 5 formed in an interlayer insulating film 4, a portion of the TiW film 3-3 is removed such that an aluminum plug 6 is directly brought into contact with the aluminum alloy film 3-2. The remaining construction of the present embodiment is same as that of the embodiment shown in FIG. 4.

Also in the present embodiment, the TiW film 3-3 serves as the antireflection film for decreasing the reflective coefficient of the lower metal wiring 3 for forming precisely patterning the lower metal wiring and also serves to improve the reliability of the lower metal wiring 3. Further, the TiW film 3-3 of the present embodiment may be formed by other high melting point metal or its alloy similar to the TiW film 3-1 of the embodiment illustrated in FIG. 4. Moreover, in the present embodiment, another high melting point metal or high melting point metal alloy film may be formed under the aluminum alloy film 3-2.

Similar to the embodiment shown in FIG. 4. the upper metal wiring 7 may be formed by a single aluminum alloy film, if the minimum line width of the upper metal wiring 7 is larger than that of the lower metal wiring 3 and the problem of decreasing the reliability of the upper metal wiring is not significant.

FIGS. 8A to 8E are cross sectional views showing successive steps of an embodiment of the method of manufacturing the multilevel interconnect structure depicted in FIG. 7 according to the invention.

At first, as shown in FIG. 8A, on an underlaying insulating film 2 formed on a silicon substrate 1, an aluminum alloy film 3-2 having a thickness of 300 to 800 nm is formed by sputtering. Then, a TiW film 3-3 having a thickness of 50 to 300 nm is formed on the aluminum alloy film 3-2 also by sputtering.

Next, a metal film consisting of a stack of the aluminum alloy film 3-2 and TiW film 3-3 is selectively processed in accordance with a desired pattern to form a lower metal wiring 3. Then, an interlayer insulating film 4 is formed on the lower metal wiring 3 as depicted in FIG. 8B. The lower metal wiring 3 may be formed by providing a resist pattern by means of an pattern exposure apparatus, removing a portion of the TiW film 3-3 which is not covered with the resist by the RIE using a fluorine containing gas, removing an exposed portion of the aluminum alloy film 3-2 by RIE using a chlorine containing gas, and removing the resist. It should be noted that the interlayer insulating film 4 may be formed in the manner explained above with reference to the embodiment shown in FIGS. 5A to 5E.

Next, as shown in FIG. 8C, a via hole 5 is formed in the interlayer insulating film 4. This process may be carried out by forming a resist mask with the aid of the exposing apparatus, removing a portion of the insulating film which is not covered with the resist by RIE using a fluorine containing gas to expose the TiW film 3-3, removing the exposed TiW film and removing the resist mask. In this case, in order to increase the wiring density it is preferable that the inner wall of the via hole 5 is substantially at right angles with respect to a surface of the silicon substrate 1.

In the present embodiment, the deterioration of the upper surface of the aluminum alloy film 3-2 and inner wall of the via hole 5 can be suppressed as compared with the previous embodiment shown in FIGS. 5A to 5E. In the present embodiment, during the etching process for forming the via hole 5 in the interlayer insulating film 4, the aluminum alloy film 3-3 is not exposed to charged particles, although the TiW film 3-3 is subject to the charged particles, but TiW film is hardly etched as compared with the aluminum alloy film. It is true that during the removal of the exposed TiW film 3-3 by the overetching RIE, the aluminum alloy film 3-2 is exposed to charged particles, but the thickness of the TiW film 3-3 is quite smaller than that of the interlayer insulating film 4, so that a time period during which the aluminum alloy film is subjected to charged particles becomes shorter than that of the embodiment shown in FIGS. 5A to 5E. Further, when the interlayer insulating film 4 is etched to form a tapered hole or a large dimensional error is introduced in this etching process, the wiring density is affected to a great extent, but these defects in the etching of the TiW film 3-3 do not affect, so that the etching condition for removing the deterioration of the etched surface can be selected at will.

Next, an aluminum plug 6 is formed in the via hole 5 as shown in FIG. 8D by selectively depositing aluminum in the via hole by means of CVD using DMAH as the starting material.

Next, an aluminum alloy film 7-1 having a thickness of 400 to 1000 nm is deposited by sputtering and then a TiW film 7-2 having a thickness of 20 to 200 nm is deposited on the film 7-1 also by sputtering. Finally, a metal film consisting of a stack of the aluminum alloy film 7-1 and TiW film 7-2 is selectively etched in accordance with a given pattern to form an upper metal wiring 7 as shown in FIG. 8E. In this manner, the bilevel interconnect structure illustrated in FIG. 7 can be manufactured.

FIGS. 9A to 9E are cross sectional views illustrating successive steps of another embodiment of the method of manufacturing the multilevel interconnect structure shown in FIG. 7.

Figure 9A:
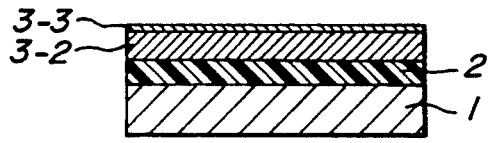
FIGS. 9A, 9B, 9C, 9D and 9E are cross sectional views illustrating successive steps of another embodiment of the method of manufacturing the multilevel interconnect structure depicted in FIG. 7.
Figure 9B:
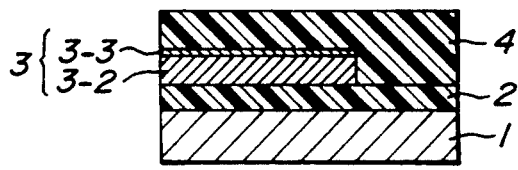

The steps depicted in FIGS. 9A and 9B are same as those shown in FIGS. 8A and 8B, respectively. That is to say, on an underlaying insulating film 2 formed on a silicon substrate 1, aluminum alloy film 3-2 and TiW film 3-3 are successively formed by sputtering. These films 3-2 and 3-3 are selectively etched in accordance with a given pattern to form a lower metal wiring 3. Then, an interlayer insulating film 4 is formed on the lower metal wiring 3.

Figure 9C:
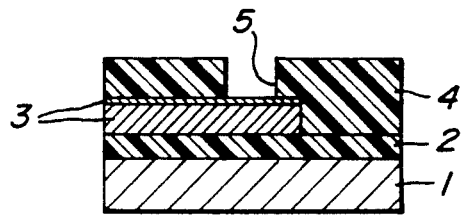
Figure 9D:
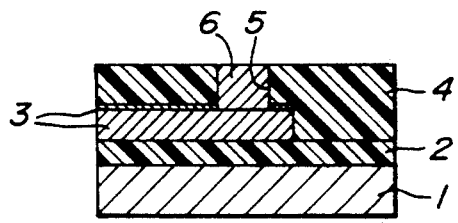
Figure 9E:
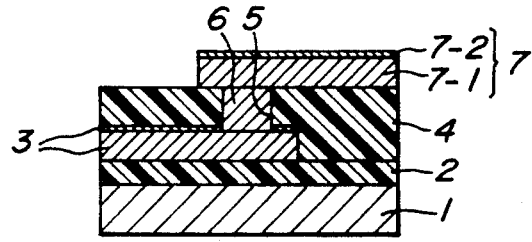

Next, a portion of the interlayer insulating film 4 at which a via hole is to be formed is selectively removed to expose a surface of the TiW film 3-3. In the present embodiment, the exposed TiW film 3-3 is not removed, but only the resist is removed as shown in FIG. 9C.

Then, the silicon wafer is introduced into the apparatus shown in FIG. 6 and is fed into the RIE chamber 22. In the RIE chamber 22, the exposed TiW film 3-3 is selectively removed. Then, the silicon wafer is transported into the CVD chamber 21 and an aluminum plug 6 is selectively deposited in the via hole 5. In this manner, in the present embodiment, the removal of the exposed TiW film 3-3 and the deposition of the aluminum plug 6 are continuously performed without exposing the silicon wafer to the atmosphere. Therefore, it is no more necessary to effect a special cleaning process and the via contact having excellent property can be attained.

Next aluminum alloy film 7-1 and TiW film 7-2 are deposited and a stack of these films is etched in accordance with a given pattern to form an upper metal wiring 7. In this manner, the bilevel interconnect structure shown in FIG. 7 can be obtained.

FIG. 10 is a cross sectional view depicting still another embodiment of the multilevel interconnect structure according to the invention.

In the embodiment shown in FIG. 7, the lower metal wiring is formed by patterning the metal film stack consisting of the aluminum alloy film 3-2 and TiW film 3-3. In the present embodiment, at first the aluminum alloy film 3-2 is etched in accordance with a given pattern and then upper surface and side wall of the aluminum film 3-2 are covered with a W film 3-4. The upper metal wiring 7 is also has the same construction as that of the lower metal wiring 3. The remaining construction of the present embodiment is same as the embodiment shown in FIG. 7.

By covering upper surface and side wall of the aluminum alloy film 3-2 with the W film 3-4, the reliability of the lower metal wiring 3 can be further improved. In a modification of the embodiment illustrated in FIG. 10, after the stack of the aluminum alloy film and TiW film has been etched in accordance with a desired pattern, the upper surface and side wall of the stack may be covered with a W film to form the lower metal wiring. In this case, the TiW film serves to improve the antireflection property as well as to improve the property of the interface between the W film and the aluminum alloy film.

Moreover, in the embodiment illustrated in FIG. 10, the upper metal wiring 7 may be formed by a single aluminum or aluminum alloy film, when the minimum line width of the upper metal wiring is larger than that of the lower metal wiring.

FIGS. 11A to 11E are cross sectional views showing successive steps of an embodiment of the method of manufacturing a modification of the multilevel interconnect structure shown in FIG. 10.

As depicted in FIG. 11A, on a silicon substrate 1 is formed an underlaying insulating film 2 and then an aluminum alloy film 3-2 having a thickness of 300 to 800 nm is deposited by sputtering.

Next, the aluminum alloy film 3-2 is etched in accordance with a given pattern by using a resist and then the resist is removed. Now a W film 3-4 having a thickness of 25 to 150 nm is selectively deposited on the upper surface and side wall of the aluminum alloy film 3-2 by CVD using a mixture of $WF_6$ and silane. In this manner, a lower metal wiring 3 is formed. Then, an interlayer insulating film 4 is formed on the lower metal wiring 3 as shown in FIG. 11B. Before etching the aluminum alloy film 3-2, a Si film having a thickness of 20 to 80 nm may be deposited for decreasing the reflective coefficient of the aluminum alloy film 3-2 for the exposing light.

Next, in the interlayer insulating film 4 there is formed a via hole 5 such that the upper surface of the W film 3-4 is exposed in the via hole. Then, after removing the exposed W film 3-4 in the via hole, an aluminum plug 6 is formed in the via hole 5 as depicted in FIG. 11D.

Then, an aluminum alloy film 7-1 having a thickness of 400 to 1000 nm is formed on the insulating film 4 by sputtering and this aluminum alloy film is shaped into a given pattern. Then, a W film 7-3 is selectively deposited on the upper surface and side wall of the aluminum alloy film 7-1 to form an upper metal wiring 7 as shown in FIG. 11E.

In the embodiment illustrated in FIGS. 11A to 11E, the W film 3-4 is removed while the via hole 5 is formed in the interlayer insulating film 4 to expose the aluminum alloy film 3-2. Similar to the embodiment shown in FIGS. 9A to 9E, it is also possible to introduce the silicon wafer into the processing apparatus illustrated in FIG. 6 after forming the via hole 5 in the interlayer insulating and to remove the exposed W film 3-4 in the via hole. Then, the aluminum plug 6 may be formed in the via hole 5 without exposing the silicon wafer to the atmosphere. In this manner, the via contact having an excellent property can be obtained.

FIGS. 12A to 12E are cross sectional views depicting successive steps of another embodiment of the method of manufacturing the multilevel interconnect structure shown in FIG. 7.

At first, as shown in FIG. 12A, on an underlaying insulating film 2 formed on a surface of a silicon substrate 1, an aluminum alloy film 3-2 having a thickness of 300 to 800 nm is formed on the insulating film 2 by sputtering. Then, a TiW film 3-3 having a thickness of 50 to 300 nm is formed on the aluminum alloy film 3-2 also by sputtering.

Next, a metal film consisting of a stack of the aluminum alloy film 3-2 and TiW film 3-3 is selectively etched in accordance with a desired pattern to form a lower metal wiring 3. Then, a resist 41 is formed on the TiW film 3-3 and the exposed interlayer insulating film 4 and then a hole 45 is formed in the resist at a portion at which a via hole is to be formed later. The TiW film 3-3 exposed in the hole 45 is removed to exposed the aluminum alloy film 3-2 as depicted in FIG. 12B.

Next, an aluminum plug 6 is formed by selectively depositing aluminum in the hole 45 by CVD using DMAH as illustrated in FIG. 12C. During the formation of the plug 6, the silicon wafer is heated to a temperature of about 260° C., so that the resist 41 must have such a property that gas is not discharged from the resist and the resist pattern is not deformed. To this end it is preferable that the resist is cured by irradiating ultraviolet rays in a highly pure nitrogen and then the resist is baked at a temperature which is higher than that at which Al-CVD is carried out for forming the plug 6.

Further, instead of the resist it is also possible to use organic insulating film such as polyimide film. In this case, after the polyimide film is applied on the silicon wafer, the silicon wafer is heated to effect the polymerization and then a plasma CVD-SiO$_2$ film is formed on the polyimide film. Next, a resist having a pattern corresponding to the via hole to be formed is formed and the CVD-SiO$_2$ film is selectively removed by RIE using a fluorine containing gas. Then, after removing the resist, the polyimide film is selectively removed by RIE using an oxygen gas to form the hole 45. This method has a heat resistance so that the gas discharge and deformation of the pattern during the formation of the Al-CVD plug 6 can be minimized although the number of steps is increased.

The selective removal of the TiW film 3-3 and the formation of the aluminum plug 6 may be carried out by separate apparatuses, but it is preferable to perform these processes continuously without exposing the silicon wafer to the atmosphere in order to obtain the via contact having excellent property.

Next, the resist 41 is removed and an interlayer insulating film 4 is formed such that an upper surface of the plug 6 is exposed from the interlayer insulating film as shown in FIG. 12D. This may be carried out by various methods. For instance, after a polyimide film has been applied and polymerized by heating, the polyimide film is etched-back to such an extent that the upper surface of the plug 6 is exposed. Alternatively, a CVD-SiO$_2$ film is deposited by plasma CVD using a by atmospheric pressure CVD using a mixture of TEOS and ozone, and then the CVD-SiO$_2$ film is etched-back such that the upper surface of the plug 6 is exposed.

Next, an aluminum oxide film formed on the upper surface of the aluminum plug 6 is removed by the sputter etching using Ar ions. Then, an aluminum alloy film 7-1 having a thickness of 400 to 1000 nm is deposited by sputtering and then a TiW film 7-2 having a thickness of 20 to 200 nm is deposited on the film 7-1 also by sputtering. Finally, a metal film consisting of a stack of the aluminum alloy film 7-1 and TiW film 7-2 is selectively etched in accordance with a given pattern to form an upper metal wiring 7 as shown in FIG. 12E. In this manner, the multilevel interconnect structure depicted in FIG. 7 can be manufactured.

As compared with the embodiment shown in FIGS. 8A to 8E, the present embodiment has the following advantages. Since the interlayer insulating film 4 is formed after the plug 6 has been formed, it is no more necessary to apply a rather complicated process for forming the fine via hole in the insulating film. Further, during the formation of the via hole by RIE, the surface of the aluminum alloy film 3-2 and the inner wall of the via hole are not stained or damaged. When the interlayer insulating film 4 is made of polyimide, it is possible to form easily the insulating film having a superior flatness and residual stress in the insulating film can be reduced. Moreover, the dielectric constant of the polyimide film is lower than that of the CVD-SiO$_2$ film, and thus the electrostatic capacitance between the metal wirings as well as between wiring lines can be decreased and the operating speed of the semiconductor device can be increased.

FIG. 13 is a cross sectional view showing still another embodiment of the multilevel interconnect structure according to the invention. In the present embodiment, an aluminum alloy film 3-2 is selectively etched and then a W film 3-4 is applied on the surface and side wall of the aluminum alloy film to form a lower metal wiring 3. Further, an inner wall of a via hole formed in an interlayer insulating film 4 is covered with a W film 42. Therefore, an aluminum plug 6 formed in the via hole 6 can be effectively prevented from being etched or corroded by water contained in the insulating film 4, so that the reliability of the device is improved.

FIGS. 14 to 19 are cross sectional views showing successive steps of an embodiment of the method of manufacturing the multilevel interconnect structure illustrated in FIG. 13.

At first, as shown in FIG. 14, on an underlaying insulating film 2 formed on a surface of a silicon substrate 1, an aluminum alloy film 3-2 having a thickness of 300 to 800 nm is formed by sputtering.

Next, the aluminum alloy film 3-2 is selectively etched in accordance with a desired pattern. After a resist 41 has been applied over the whole surface of the silicon wafer, a hole 45 is formed in the resist at a portion at which a via hole is to be formed as illustrated in FIG. 15. In this manner, the aluminum alloy film 3-2 is exposed in the hole 45.

Next, an aluminum plug 6 is formed by selectively depositing aluminum in the hole 45 by CVD using DMAH as illustrated in FIG. 16. Also in the present embodiment, instead of the resist 41 it is possible to use an organic insulating film such as a polyimide film.

Then, after removing the resist, a W film 3-4 having a thickness of 25 to 150 nm is selectively formed only on the surface and side wall of the aluminum alloy film 3-2 to form a lower metal wiring 3 as shown in FIG. 17 by CVD using a mixture of WF$_6$ and silane. At the same time, a W film 42 is formed on the aluminum plug 6.

Next, an interlayer insulating film 4 is formed such that an upper surface of the W film 42 on the plug 6 is exposed as shown in FIG. 18. This may be carried out by various methods. For instance, after a polyimide film has been applied and polymerized by heating, the polyimide film is etched-back to such an extent that the W film 42 is exposed. Alternatively, a CVD-SiO$_2$ film is deposited by plasma CVD using a mixture of TEOS and oxygen, a CVD-SiO$_2$ film is deposited by atmospheric pressure CVD using a mixture of TEOS and ozone, and then the CVD-SiO$_2$ film is etched-back such that the W film 42 is exposed.

Next, the exposed W film 42 formed on the upper surface of the aluminum plug 6 is removed by RIE using a fluorine containing gas. Then, after removing an aluminum oxide film formed on the upper surface of the plug 6 by suptter-etching using Ar ions, an aluminum alloy film 7-1 having a thickness of 400 to 1000 nm is deposited by sputtering. Then, the aluminum alloy film 7-1 is selectively etched in accordance with a given pattern and then a W film 7-3 is selectively deposited on the surface and side wall of the aluminum alloy film 7-1 to form an upper metal wiring 7 as shown in FIG. 19. In this manner, the multilevel interconnect structure depicted in FIG. 13 can be obtained.

FIGS. 20A, 20B to 26A, 26B are cross sectional views showing successive steps of an embodiment of the method of manufacturing the multilevel interconnect structure according to the invention. It should be noted that a plane of FIGS. 20A, 21A-26A and a plane of FIGS. 20B, 21B-26B are perpendicular to each other.

At first, as illustrated in FIGS. 20A and 20B, on an underlaying insulating film 2 formed on a silicon substrate 1, an aluminum alloy film 3-2 having a thickness of 300 to 800 nm and a TiW film 3-3 having a thickness of 20 to 100 nm are successively formed by sputtering.

Then, a stack of these films 3-2 and 3-3 is selectively etched in accordance with a given pattern to form a lower metal wiring 3. Then, an interlayer insulating film 31 having a thickness of 1 to 2.5 $\mu$m is formed on the lower metal wiring 3 as shown in FIGS. 21A and 21B. The interlayer insulating film 31 may be formed by depositing a CVD-SiO$_2$ film having a thickness of 100 nm by plasma CVD using a mixture of TEOS and oxygen, depositing a CVD-SiO$_2$ film having a thickness of 2 $\mu$m by atmospheric pressure CVD using a mixture of TEOS thickness at a flat portion becomes equal to 1.2 $\mu$m, and depositing a CVD-SiO$_2$ film having a thickness of 500 nm by plasma CVD using TEOS and oxygen mixture gas.

Next, a resist is applied on the silicon wafer and a portion of the resist corresponding to an upper metal wiring to be formed is selectively removed. Then, a wiring recess 32 having a depth of 0.5 to 1.2 $\mu$m is formed in a surface of the insulating film 31 by RIE using a fluorine containing gas, and the resist is removed as depicted in FIG. 22A and 22B. Next, a resist is formed and a portion of the resist corresponding to a portion at which a via hole is to be formed is selectively removed. Next, the insulating film 31 is selectively removed by RIE using a fluorine containing gas and a via hole 5 having a depth of 0.5 to 1.2 $\mu$m is formed to expose the TiW film 3-3. Then, the thus exposed TiW film is removed and the resist is removed as illustrated in FIGS. 23A and 23B.

Then, as shown in FIGS. 24A and 24B, an aluminum plug 6 is formed in the via hole 5 by selectively depositing aluminum in the via hole 5 by means of CVD using organic aluminum compound such as DMAH. As explained before, the removal of the TiW film 3-3 and the formation of the aluminum plug 6 may be advantageously performed continuously without exposing the silicon wafer to the atmosphere. In this case, after the via hole has been formed, only the resist is removed.

Next, a TiW film 33 having a thickness of 20 to 200 nm is deposited on the whole surface by sputtering and then the TiW film is etched-back to remain the TiW film 33 only on the side wall of the wiring recess 32 as shown in FIGS. 25A and 25B.

Then, an aluminum alloy film 7-1 is selectively formed in the wiring recess 32 to form an upper metal wiring 7 as illustrated in FIGS. 26A and 26B. The aluminum alloy film 7-1 may be formed by depositing an aluminum alloy film by sputtering in which the step coverage is improved by controlling the temperature of the silicon wafer during the sputtering and then the aluminum alloy film may be etched-back such that the aluminum alloy film is remained only in the wiring recess. In this method, the aluminum alloy film may be formed by depositing a first aluminum alloy film having a thickness of 20 to 100 $\mu$m by sputtering and then a second aluminum alloy film may be deposited on the first aluminum alloy film by CVD, while these first and second aluminum alloy films are successively formed without exposing the silicon wafer to the atmosphere. Alternatively, the aluminum film may be formed by first forming aluminum deposition seeds by irradiating hydrogen radicals produced by plasma discharge and then depositing an aluminum alloy film by CVD.

As compared with the method shown in FIGS. 8A to 8E, in the present embodiment, the wiring recess 32 is formed in the upper surface of the interlayer insulating film 31 and the upper metal wring 7 is formed by the aluminum alloy film 7-1 filled in the wiring recess, so that the upper surface of the upper metal wiring can be made flat without using a complicated process. Therefore, the multilevel metal wiring structure of the present embodiment is preferable to construct another metal wiring on the upper metal wiring.

In order to confirm the superiority of the multilevel interconnect structure according to the invention, the following experiment has been conducted. At first a multilevel interconnect structure shown in FIG. 27 was manufactured by a method similar to that shown in FIGS. 8A to 8E. This multilevel interconnect structure according to the invention is similar to that illustrated in FIG. 7 except for a point that the upper metal wiring 7 is formed by an aluminum film 7-4. An initial resistance of the via contact through the via hole having a diameter of 0.8 $\mu$m was about 0.2 $\Omega$. As a comparative sample, a multilevel interconnect structure shown in FIG. 28 was manufactured by a method disclosed in the above mentioned reference 4. In this known multilevel interconnect structure, on an underlaying insulating film 102 were formed Al—Cu alloy film 103-5 and TiN film 103-6 and then an interlayer insulating film 104 was formed on the TiN film 103-6. Next, a via hole 105 was formed in the interlayer insulating film 104 such that the Al—Cu alloy film 103-5 was exposed in the via hole. Then, on the interlayer insulating film 104 as well as on the inner wall of the via hole 105 Ti film 107-5 and TiN film 107-6 were successively deposited. A W plug 108 was formed in the via hole 105 and further an Al—Cu film 107-7 was deposited on the TiN film 107-6 such that the Al-Cu film 107-7 was brought into contact with the upper end of the W plug 108. An initial resistance of the via contact through the via hole having a diameter of 0.8 $\mu$m was about 0.5 $\Omega$ which is higher than that of the present invention.

Figure 27:
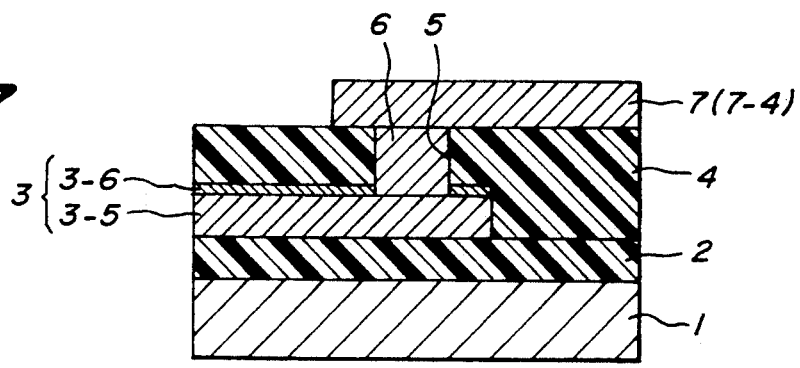
FIG. 27 is a cross sectional view showing an embodiment of the multilevel interconnect structure according to the invention which was used for the electromigration test.
Figure 28:
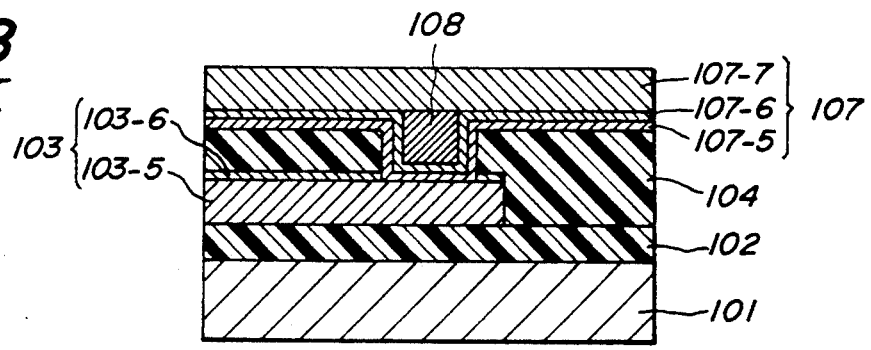
FIG. 28 is a cross sectional view showing a known multilever interconnect structure which was also used as a comparative sample in the electromigration test.
Figure 29:
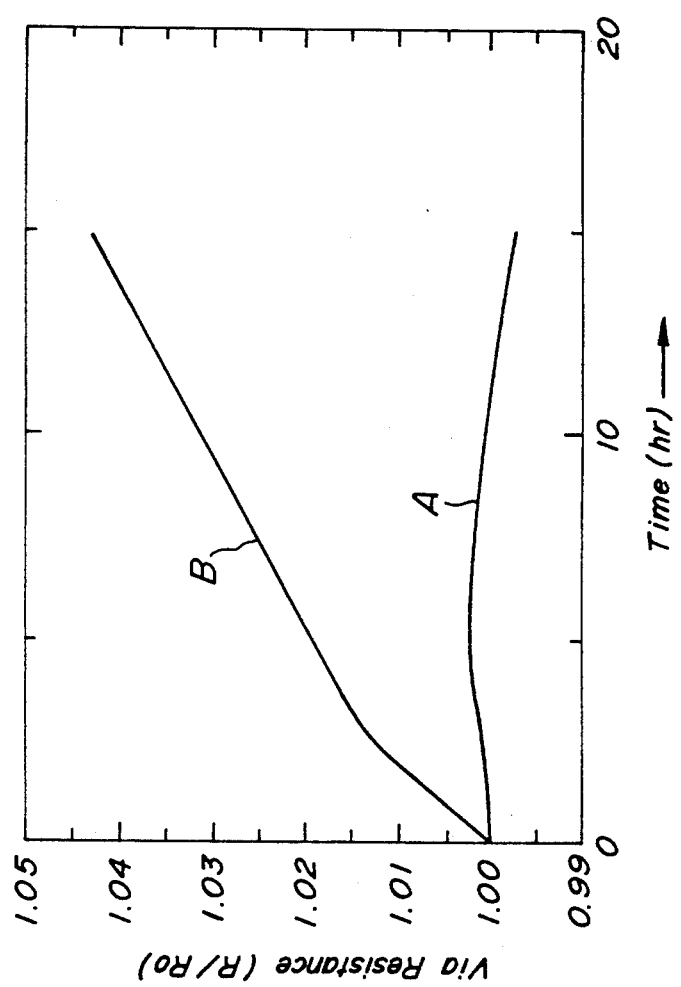
FIG. 29 is a graph representing a result of the electromigration test.

Next the electromigration test was carried out by passing currents through the via portions of the above mentioned multilevel interconnect structures shown in FIGS. 27 and 28. The result of this test is shown in FIG. 29. In FIG. 29 a horizontal axis denotes a time in hour and a vertical axis represents a variation in the via resistance, i.e. a ratio of a via resistance R to the initial via resistance R$_0$.

In the multilevel interconnect structure according to the invention, the via resistance is not substantially changed over fifteen hours as depicted by a curve A, but in the known multilevel interconnect structure, the via resistance increases abruptly from a start of the test as illustrated by a curve B. From the above experiment, it has been confirmed that the multilevel interconnect structure according to the invention has superior initial characteristic and reliability to those of the known multilevel interconnect structure.

As explained above in detail, according to the present invention, the lower metal wiring has a construction such that it comprises at least one aluminum or aluminum alloy film and at least one high melting point metal or high melting point metal alloy film or the aluminum or aluminum alloy film whose upper surface and side wall are covered with the high melting point metal or high melting point metal alloy film. Therefore, the stressmigration reliability can be improved to a large extent.

Further, the via hole is filled with the aluminum or aluminum alloy plug and the lower and upper ends of the plug are brought into contact with the aluminum or aluminum alloy film, and thus there is not provided any undesired interface between different kinds of metals. Therefore, the via resistance can be decreased and the operating speed is increased and hillock and void are hardly produced near the via hole due to the electromigration. In this manner, the reliability of the semiconductor device having the multilevel interconnect structure according to the invention can be improved.

What is claimed is:

1. A method of manufacturing a multilevel interconnect structure for use in a semiconductor device comprising the steps of:
    forming a lower metal wiring having a given pattern on a semiconductor substrate, said lower metal wiring comprising at least one aluminum or aluminum alloy film and at least one high melting point metal or high melting metal alloy film;
    forming an interlayer insulating film on said lower metal wiring;
    forming a via hole in said interlayer insulating film such that said aluminum or aluminum alloy film is exposed at a bottom of the via hole;
    forming a plug made of aluminum or aluminum alloy in said via hole such that a lower end of said plug is directly contacted with the aluminum or aluminum alloy film of the lower metal wiring; and
    forming an upper metal wiring comprising an aluminum or aluminum alloy film which is directly contacted with an upper end of said plug.

2. A method according to claim 1, wherein said lower metal wiring is formed by depositing an aluminum or aluminum alloy film on the semiconductor substrate, depositing a high melting point metal or high melting point metal alloy on said aluminum or aluminum alloy film, and selectively etching these films in accordance with a given pattern.

3. A method according to claim 1, wherein said lower metal wiring is formed by depositing an aluminum or aluminum alloy film on said semiconductor substrate, selectively removing said aluminum or aluminum alloy film in accordance with said given pattern, and depositing a high melting point metal or high melting point metal alloy on an upper surface and side wall of the aluminum or aluminum alloy film.

4. A method according to claim 2, wherein said via hole is formed in the interlayer insulating film such that an upper surface of the high melting point metal or high melting point metal alloy film is exposed in the via hole, and before forming said plug in the via hole, said exposed high melting point metal or high melting point metal alloy is selectively removed.

5. A method according to claim 4, wherein the removal of the exposed high melting point metal or high melting point metal alloy film and the formation of the plug in the via hole are performed continuously without exposing the semiconductor substrate to the atmosphere.

6. A method according to claim 1, wherein said plug is formed by selectively depositing aluminum or aluminum alloy in the via hole by a chemical vapor deposition using an organic aluminum compound gas.

7. A method according to claim 1, wherein prior to forming the via hole in the insulating film, a wiring recess is formed in an upper surface of the insulating film and said upper metal wiring is formed in said wiring recess.

8. A method of manufacturing a multilevel interconnect structure for use in a semiconductor device comprising the steps of:
    forming a lower metal wiring having a given pattern on a semiconductor substrate, said lower metal wiring comprising at least one aluminum or aluminum alloy film and at least one high melting point metal or high melting metal alloy film;
    forming a plug on said aluminum or aluminum alloy film of the lower metal wiring, said plug being made of aluminum or aluminum alloy;
    forming an interlayer insulating film on said lower metal wiring such that an upper end of said plug is exposed from the interlayer insulating film; and
    forming an upper metal wiring comprising an aluminum or aluminum alloy film which is directly contacted with the upper end of said plug.

9. A method according to claim 8, wherein said lower metal wiring is formed by depositing an aluminum or aluminum alloy film on the semiconductor substrate, depositing a high melting point metal or high melting point metal alloy on said aluminum or aluminum alloy film, and selectively etching these films in accordance with a given pattern.

10. A method according to claim 9, wherein a portion of said high melting point metal or high melting point metal alloy film corresponding to a portion at which the plug is to be formed is selectively removed to expose a corresponding portion of said aluminum or aluminum alloy film and then said plug is formed on said portion of the aluminum or aluminum alloy film.

11. A method according to claim 10, wherein the removal of the exposed high melting point metal or high melting point metal alloy film and the formation of the plug on the aluminum or aluminum alloy film are performed continuously without exposing the semiconductor substrate to the atmosphere.

12. A method according to claim 8, wherein said interlayer insulating film is made of organic insulating material.

13. A method according to claim 8, wherein said plug is formed by selectively depositing aluminum or aluminum alloy in the via hole by a chemical vapor deposition using an organic aluminum compound gas.

14. A method of manufacturing a multilevel interconnect structure for use in a semiconductor device comprising the steps of:
    depositing an aluminum or aluminum alloy film on a semiconductor substrate;
    selectively etching said aluminum or aluminum alloy film in accordance with a given pattern to form a fine wire;
    forming a plug on said fine wire formed by said aluminum or aluminum alloy film, said plug being made of aluminum or aluminum alloy;
    covering upper surface and side wall of said fine wire with a high melting point metal or high melting point metal alloy film to form a lower metal wiring having said given pattern;

covering at least a side wall of said plug with a high melting point metal or high melting point metal alloy film;

forming an interlayer insulating film on said lower metal wiring such that an upper end of said plug is exposed from the interlayer insulating film; and forming an upper metal wiring comprising an aluminum or aluminum alloy film which is directly contacted with the upper end of said plug.

15. A method according to claim 14, wherein said side wall and upper surface of the plug is covered with the high melting point metal or high melting metal alloy film, said interlayer insulating film is formed such that said high melting point metal or high melting point metal alloy film provided on the upper surface of the plug is exposed, and prior to forming the upper metal wiring, said exposed high melting point metal or high melting point metal alloy film is removed.

16. A method according to claim 14, wherein said interlayer insulating film is made of organic insulating material.

17. A method according to claim 14, wherein said plug is formed by selectively depositing aluminum or aluminum alloy in the via hole by a chemical vapor deposition using an organic aluminum compound gas.

* * * * *